United States Patent [19]
Fukuoka et al.

[11] Patent Number: 5,463,266
[45] Date of Patent: Oct. 31, 1995

[54] PIEZOELECTRIC TRANSFORMER HAVING IMPROVED ELECTRODE ARRANGEMENT

[75] Inventors: Akira Fukuoka; Jun Kawai; Satoru Tagami, all of Tokyo, Japan

[73] Assignee: NEC Corporation, Tokyo, Japan

[21] Appl. No.: 177,069

[22] Filed: Jan. 3, 1994

[30] Foreign Application Priority Data

Dec. 31, 1992 [JP] Japan ..................... 4-360174

[51] Int. Cl.$^6$ ................................. H01L 41/08
[52] U.S. Cl. ........................... 310/359; 310/366
[58] Field of Search .................. 310/358, 359, 310/366

[56] References Cited

U.S. PATENT DOCUMENTS

| | | | |
|---|---|---|---|
| 2,974,296 | 3/1961 | Rosen | 310/359 X |
| 3,562,792 | 2/1971 | Berlincourt | 310/359 |
| 3,659,127 | 4/1972 | Kumon | 310/9.5 |
| 3,736,446 | 5/1973 | Berlincourt et al. | 310/359 |
| 3,764,848 | 10/1973 | Berlincourt | 315/55 |
| 5,118,982 | 6/1992 | Inoue et al. | 310/366 |

Primary Examiner—Mark O. Budd
Attorney, Agent, or Firm—Sughrue, Mion, Zinn, Macpeak & Seas

[57] ABSTRACT

A long thin rectangular body of piezoelectric material is divided, in the longitudinal direction thereof, into a plurality of regions which include at least one driving region and at least one driven region. The driven region includes two electrodes which are formed such as to respectively cover opposite side surfaces of the driven region in a plane parallel to the longitudinal direction and to respectively extend inwardly in a transverse direction of the body by a predetermined amount over two major surfaces of the driven region. The driven region is polarized in a lateral direction of the body. As an alternative, the driven region is provided with two electrodes each of which consists of a pair of relatively narrow strip-like portions. The strip-like portions of one electrode extend over the two major surfaces adjacent to one edge of the driven region in the longitudinal direction of the body. The strip-like portions of the other electrode are similarly provided at the opposite side of the driven region. The driven region is polarized in a direction perpendicular to the longitudinal direction of the body.

7 Claims, 11 Drawing Sheets

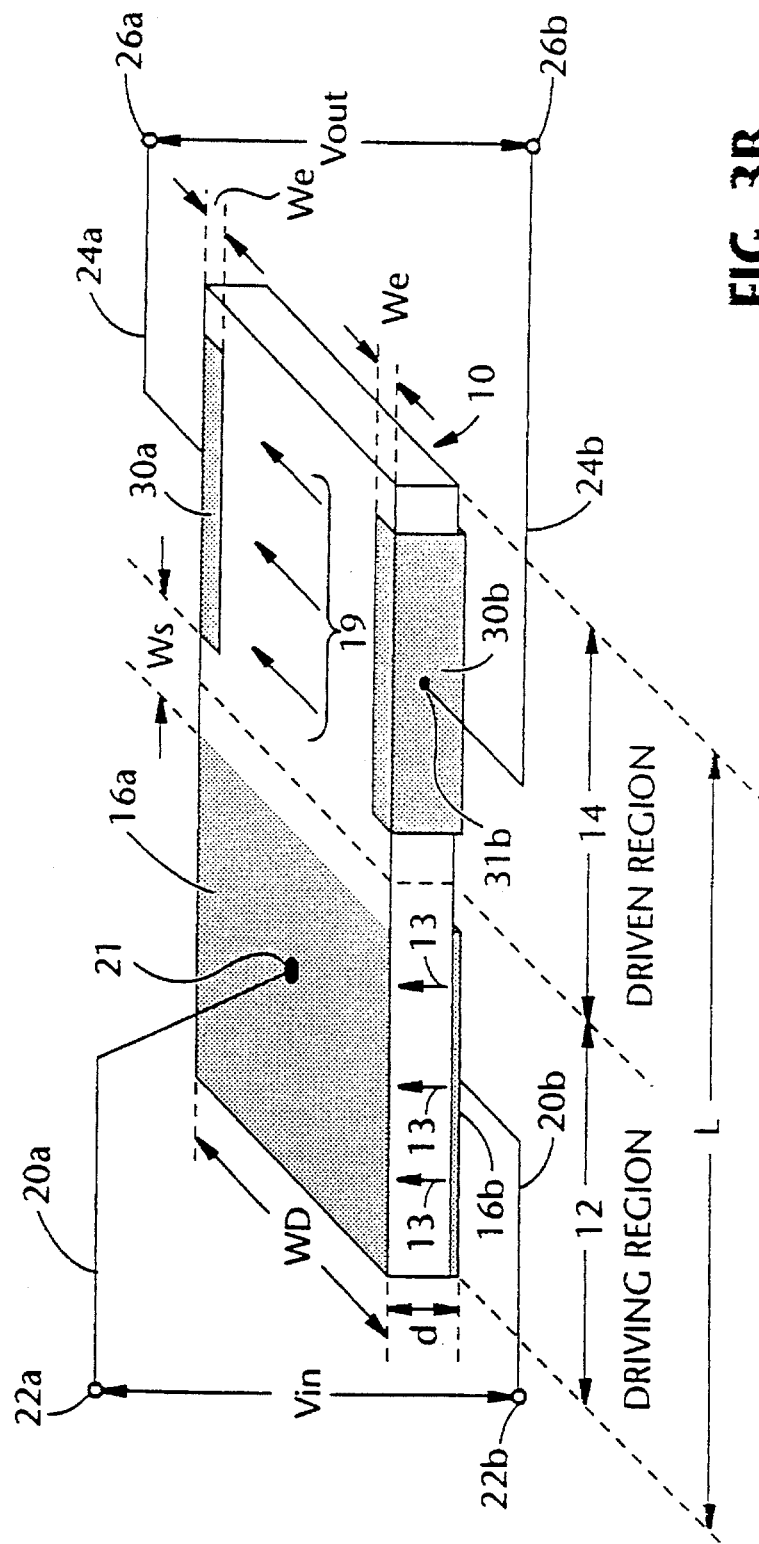
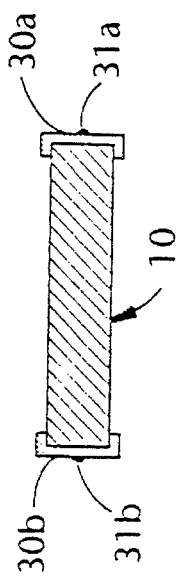
FIG. 3A
FIG. 3B

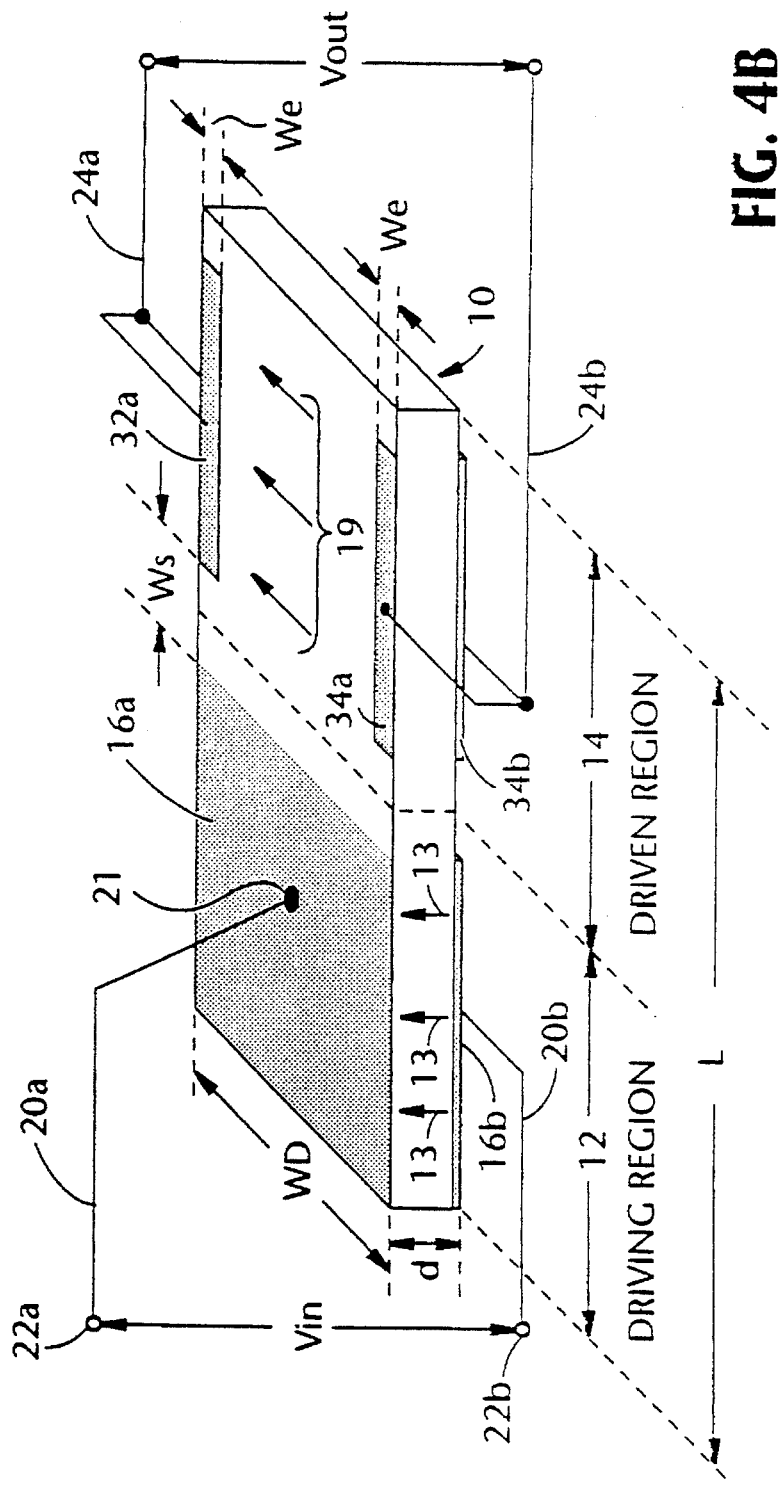
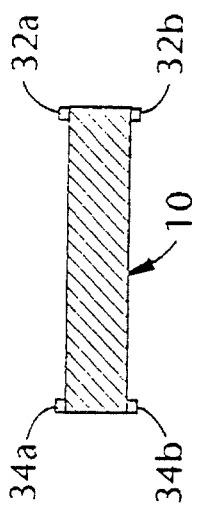
FIG. 4A
FIG. 4B

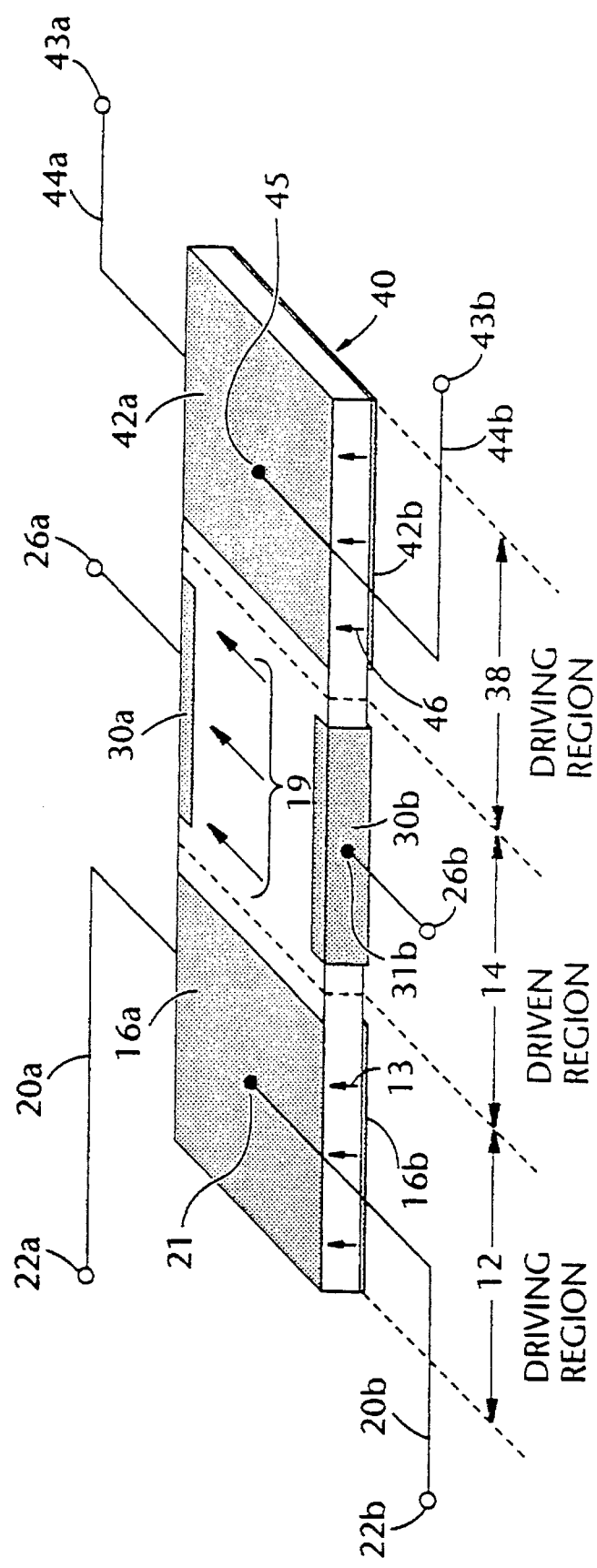

PIEZOELECTRIC TRANSFORMER HAVING IMPROVED ELECTRODE ARRANGEMENT

BACKGROUND OF THE INVENTION

1. Field of the Invention

The present invention relates generally to a piezoelectric transformer, and more specifically to a voltage step-up type piezoelectric transformer which features an improved electrode arrangement which reduces the size of the transformer and ensures highly reliable operation thereof.

2. Description of Related Art

In most of cases, an electromagnetic type transformer is used for generating a high output voltage, of the nature used in photocopiers, backlights of LCD (Liquid Crystal Displays) or the like.

On the other hand, a piezoelectric transformer which operates on a principle which is totally different from that of a conventional electromagnetic transformer, has been proposed.

Throughout the instant disclosure, like portions or elements of the drawings are denoted by like reference numerals.

Before turning to the present invention it is deemed preferable to describe two conventional step-up type piezoelectric transformers with reference to FIGS. 1 and 2.

The piezoelectric transformer as shown in FIG. 1 is disclosed in U.S. Pat. No. 2,974,296 granted to C. A. Rosen (Prior Art 1).

As shown in FIG. 1, a long relatively thin rectangular body 10 of piezoelectric material is divided into two regions 12 and 14 each of which extends in a longitudinal direction of the body 10 a distance equal to one half of the length thereof. The region 12 is called a driving region while the region 14 is called a driven region (or power generating region).

A pair of electrodes 16a and 16b is applied to upper and lower surfaces of the driving region 12. On the other hand, the driven region 14 has an electrode 18 applied to the end of the body 10 remote from the region 12. The driving region 12 is polarized in the thickness direction of the body 10 as indicated by arrows 13 while the driven region 14 is polarized in the longitudinal direction of the body 10 as indicated by arrows 15.

A connection wire 20a has one end thereof fixedly coupled to a junction 21 provided at the center of the electrode 16a. Similarly, a connection wire 20b has one end thereof fixedly coupled to a junction (not shown) provided at the center of the electrode 16b. On the other hand, a connection wire 24a is provided between a junction 25 and an output terminal 26a. Further, a connection wire 24b has one end thereof coupled to an output terminal 26b and the other end thereof coupled to the wire 20b.

If an input voltage Vin applied to the pair of input terminals 22a and 22b has a frequency equal to that of the longitudinal resonant mechanical vibration of the body 10, the body 10 is caused to resonantly vibrate. Thus, a high AC (alternating current) voltage Vout is obtained between the output terminals 26a and 26b. The frequency of the output voltage Vout is identical to that of the input voltage Vin.

The piezoelectric transformer of Prior Art 1 shown in FIG. 1, however, has encountered the drawback that all the junctions of the transformer are not provided at resonance nodes of the body 10. Therefore, a junction which is not provided at a resonance node, is apt to be detached from the corresponding electrode due to mechanical vibration.

FIG. 2 shows another conventional piezoelectric transformer which is disclosed in a Japanese paper entitled "Electronic Luminescence" issued March 1971, page 65 (Prior Art 2).

The transformer of FIG. 2 is similar to that of FIG. 1 except for the driven region 14. That is, the driven region 14 of FIG. 2 is polarized transversely of the body 10 as indicated by arrows and provided with two electrodes 18a and 18b at the opposite sides in a plane parallel to the longitudinal direction of the body 10. Two output wires 24a' and 24b' are respectively coupled to the electrodes 18a and 18b via corresponding junctions 23a and 23b. It is known in the art that in order to generate a high output voltage, it is necessary to reduce the thickness of the body to a considerable extent (such as less than 1 mm). Therefore, the arrangement of FIG. 2 has encountered the drawback that it is practically difficult to secure the electrodes 18a and 18b to such dimensionally limited side faces. Further, the electrodes 18a and 18b are liable to deteriorate during the processes of polarization and junction application to the electrodes.

SUMMARY OF THE INVENTION

It is therefore an object of the present invention to provide a piezoelectric transformer which features an improved electrode arrangement by which a high transformation ratio can be attained without increasing the size of the transformer.

In brief, the above object is achieved by an arrangement which includes a long thin rectangular body of piezoelectric material is divided, in the longitudinal direction thereof, into a plurality of regions which include at least one driving region and at least one driven region. The driven region includes two electrodes which are formed such as to respectively cover opposite side surfaces of the driven region in a plane parallel to the longitudinal direction and to respectively extend inwardly in a transverse direction of the body by a predetermined amount over two major surfaces of the driven region. The driven region is polarized in a lateral direction of the body. As an alternative, the driven region is provided with two electrodes each of which consists of a pair of relatively narrow strip-like portions. The strip-like portions of one electrode extend over the two major surfaces adjacent to one edge of the driven region in the longitudinal direction of the body. The strip-like portions of the other electrode are similarly provided at the opposite side of the driven region. The driven region is polarized in a direction perpendicular to the longitudinal direction of the body.

More specifically, a first aspect of the present invention resides in a piezoelectric transformer which comprises a long relatively thin rectangular body of piezoelectric material. The body has first and second major surfaces and exhibits a resonance mode of vibration at a predetermined frequency in a longitudinal direction thereof. The body is divided into a plurality of regions in the longitudinal direction. First and second electrodes are applied respectively to the first and second major surfaces of a first region of the plurality of regions. The first region is polarized in a thickness direction of the body. Further, third and fourth electrodes are formed such as to respectively cover opposite side surfaces of a second region of the plurality of regions in a plane parallel to the longitudinal direction of the body and to respectively extend inwardly in a transverse direction of the body by a predetermined amount over the first and second major surfaces of the second region. The second region is polarized in a direction perpendicular to the longitudinal direction.

A second aspect of the present invention resides in a piezoelectric transformer comprises a long relatively thin rectangular body of piezoelectric material. The body having first and second major surfaces and exhibits a resonance mode of vibration at a predetermined frequency in a longitudinal direction thereof. The body is divided into first and second regions in the longitudinal direction. First and second electrodes are applied respectively to the first and second major surfaces of the first region. The first region is polarized in a thickness direction of the body. Further, third and fourth electrodes are applied to the second region. Each of the third and fourth electrodes consists of a pair of relatively narrow strip-like portions. The strip-like portions of the third electrode extends over the first and second major surfaces adjacent to one edge of the second region in a direction parallel to the longitudinal direction of the body. The strip-like portions of the fourth electrode extends over the first and second major surfaces adjacent to the other edge of the second region in a direction parallel to the longitudinal direction of the body. The second region is polarized in a direction perpendicular to the longitudinal direction.

A third aspect of the present invention resides in a piezoelectric transformer comprises a long rectangular body of piezoelectric material. The body has first and second major surfaces and exhibits a resonance mode of vibration at a predetermined frequency in a longitudinal direction thereof. The body is divided into first and second regions in the longitudinal direction. First and second electrodes are applied to the first region. The first electrode has first, second and third portions. The first portion is formed on the first major surface of the first region. The second portion is provided on one side surface of the body in a plane parallel to the longitudinal direction of the body. The third portion includes a plurality of layers which extend inwardly in parallel from the second portion. The second electrode has fourth, fifth and sixth portions. The fourth portion is formed on the second major surface of the first region. The fifth portion is provided on the other side surface opposite to the one side surface. The sixth portion includes a plurality of layers which extend inwardly in parallel from the fifth portion. The layers of the third and sixth portions being alternately provided in a thickness direction of the body. Further, third and fourth electrodes are applied to the second region and are formed such as to cover opposite side surfaces of the body in a plane parallel to the longitudinal direction and to respectively extend inwardly in a transverse direction of the body at a predetermined amount over the first and second major surfaces. The second region is polarized in a direction perpendicular to the longitudinal direction.

BRIEF DESCRIPTION OF THE DRAWINGS

The features and advantages of the present invention will become more clearly appreciated from the following description taken in conjunction with the accompanying drawings in which like portions are denoted by like reference numerals and in which:

FIG. 3A is a schematic perspective view of a first embodiment of the present invention;

FIG. 3B is a cross section of a driven region of the first embodiment of FIG. 3A;

FIG. 4A is a schematic perspective view of a second embodiment of the present invention;

FIG. 4B is a cross section of a driven region of the second embodiment of FIG. 4A;

FIG. 5 is a schematic perspective view of a third embodiment of the present invention;

DETAILED DESCRIPTION OF THE PREFERRED EMBODIMENTS

Before discussing the preferred embodiments of the present invention, the common points or conditions applicable to all the embodiments are listed below.

(1) A sintered material which is commercially available from Tokin (Japanese company) under trademark "NEPEC 8" is used. This material has a small electro-mechanical coupling coefficient $K_{31}$ (in a direction perpendicular to a polarization direction) and a large electro-mechanical coupling coefficient $K_{33}$ (in a polarization direction). A block of the above-mentioned sintered material was cut into a desired size for producing the body of each of the preferred embodiments.

(2) Electrodes are formed on the body by patterning silver-palladium paste containing 75% of silver and 25% of palladium by way of known thick film screen techniques. Following this, the patterned electrodes are subjected to sintering at a temperature of 600° C.

(3) The body to which the electrodes have been applied, is immersed in an insulating oil pre-heated to a temperature of 150° C. Subsequently, DC electric field strength of 1.5 KV/mm in the thickness direction and 1.1 mmV/m in a transverse direction of the body is applied to the immersed body for 15 minutes to induce polarization.

(4) Copper wires of 0.1φ are attached to the junctions each located at a mechanical node.

EMBODIMENT 1

Reference is made to FIGS. 3A and 3B, where a first embodiment of the present invention is shown in perspective and cross sectional views, respectively.

Figure 1:
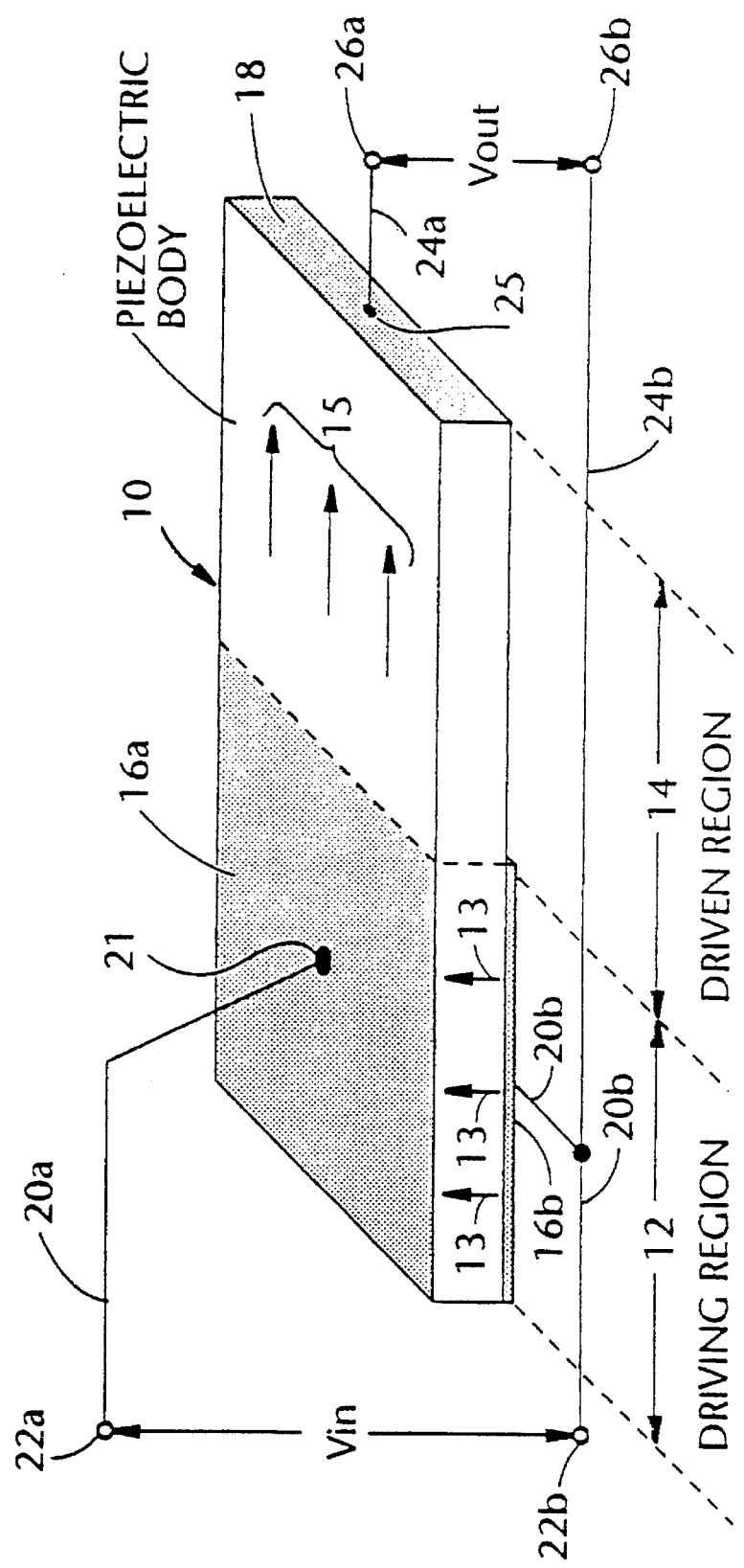
FIG. 1 is a schematic perspective view of a conventional piezoelectric transformer referred to in the opening paragraphs of the instant disclosure.
Figure 2:
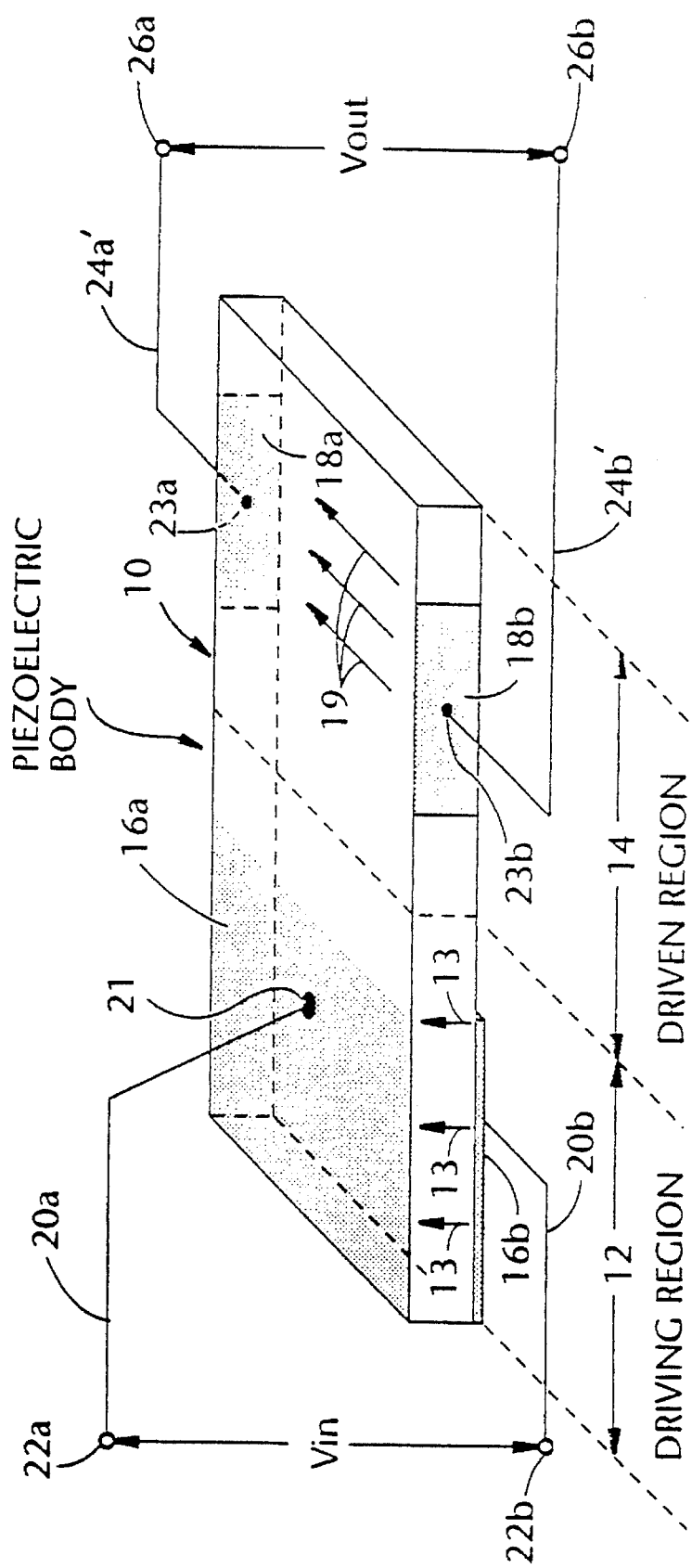
FIG. 2 is a schematic perspective view of another conventional piezoelectric transformer referred to in the opening paragraphs of the instant disclosure.

The transformer shown in FIG. 3A is provided with a pair of electrodes 30a and 30b which are differently configured from the counterparts 18a and 18b of FIG. 2. Other than this, the transformer of FIG. 3A is essentially the same as that of FIG. 2. As best shown in FIG. 3B, the electrodes 30a and 30b are formed such as to respectively cover the opposite side surfaces of the body 10 in a plane parallel to the longitudinal direction and to respectively extend inwardly in the transverse direction of the body 10 at a predetermined dimension on the major surfaces of the body 10.

The body 10 of FIG. 3A vibrates in a mechanical resonance mode of $\lambda$ or $2\lambda$ ($\lambda$ denotes a resonance wavelength). Therefore, the pair of the junctions of the driving region 12 (only one junction is represented by numeral 21) are attached at the resonance node. Similarly, two junctions 31a and 31b (see FIG. 3B) are respectively applied to the electrodes 30a and 30b at resonance nodes of the body 10.

During experiments the transformer shown in FIG. 3A was fabricated such that the body 10 had a length (L) of 75.0 mm, a width (WD) of 20.0 mm, and a thickness (d) of 1.6 mm. Each of the electrode portions which extended along the major surfaces of the body 10, denoted by We in the drawing, was 1 mm wide. The electrodes of the driving and driven regions 12 and 14 were separated at the central portion of the body 10 by a distance of 8 mm (denoted by Ws in FIG. 3A) in the longitudinal direction. When a sine wave voltage of 24 V is applied as Vin, the body 10 resonated at 32 KHz. The output voltage Vout was measured at 1050 V when an output impedance was 676 K$\Omega$. The output electric power was 2.5 Watts.

EMBODIMENT 2

Referring to FIGS. 4A and 4B, there is shown a second embodiment of the present invention in perspective and cross sectional views, respectively.

The driven region 14 of the second embodiment is provided with two pairs of electrodes 32a–32b and 34a–34b in lieu of the electrodes 30a and 30b of the first embodiment. The remaining portions of the second embodiment are essentially identical to those of the first embodiment and hence further descriptions thereof will be omitted for brevity.

As shown, in accordance with the second embodiment, each of the electrodes 32a–32b and 34a–34b has a relatively narrow strip-like configuration which extends over major surfaces adjacent to opposite edges and parallel to the longitudinal direction of the body 10. Each of the electrodes 32a–32b and 34a–34b is provided on the major surfaces of the body 10 and hence, the second embodiment has advantages in the case where the thickness of the body 10 is very small. That is, it enables easy application of the junction to the electrodes 32a–32b and 34a–34b as compared to the application of the junctions to the electrodes provided at the side surfaces.

EMBODIMENT 3

Reference is made to FIG. 5, where a third embodiment of the present invention is shown in perspective view.

The transformer shown in FIG. 5 is further provided with a second driving region 38. The driving region 38 has a pair of electrodes 42a and 42b which are coupled to output terminals 43a and 43b via lines 44a and 44b, respectively. A pair of junctions (only one, denoted by numeral 45, being shown in this figure) is respectively applied to the electrodes 42a and 42b in the same manner as the driving region 12. Further, the driving region 38 is polarized as shown by arrows 46.

The piezoelectric body 40 of FIG. 5 vibrates in a mechanical resonance mode of $3\lambda/2$. It is understood that all the junctions of the third embodiment are attached to the resonance nodes of the body 40.

The transformer shown in FIG. 5 was fabricated such that the body 40 had a length of 112.5 mm, a width of 20.0 mm, and a thickness of 1.6 mm. The electrodes on the regions 12, 14 and 38 are separated by 8 mm in the longitudinal direction. When a sine wave voltage of 24 V was applied as Vin, the body 40 resonated at 32 KHz. The output voltage Vout was 1300 V when an output impedance was 338 K$\Omega$.

EMBODIMENT 4

Figure 6:
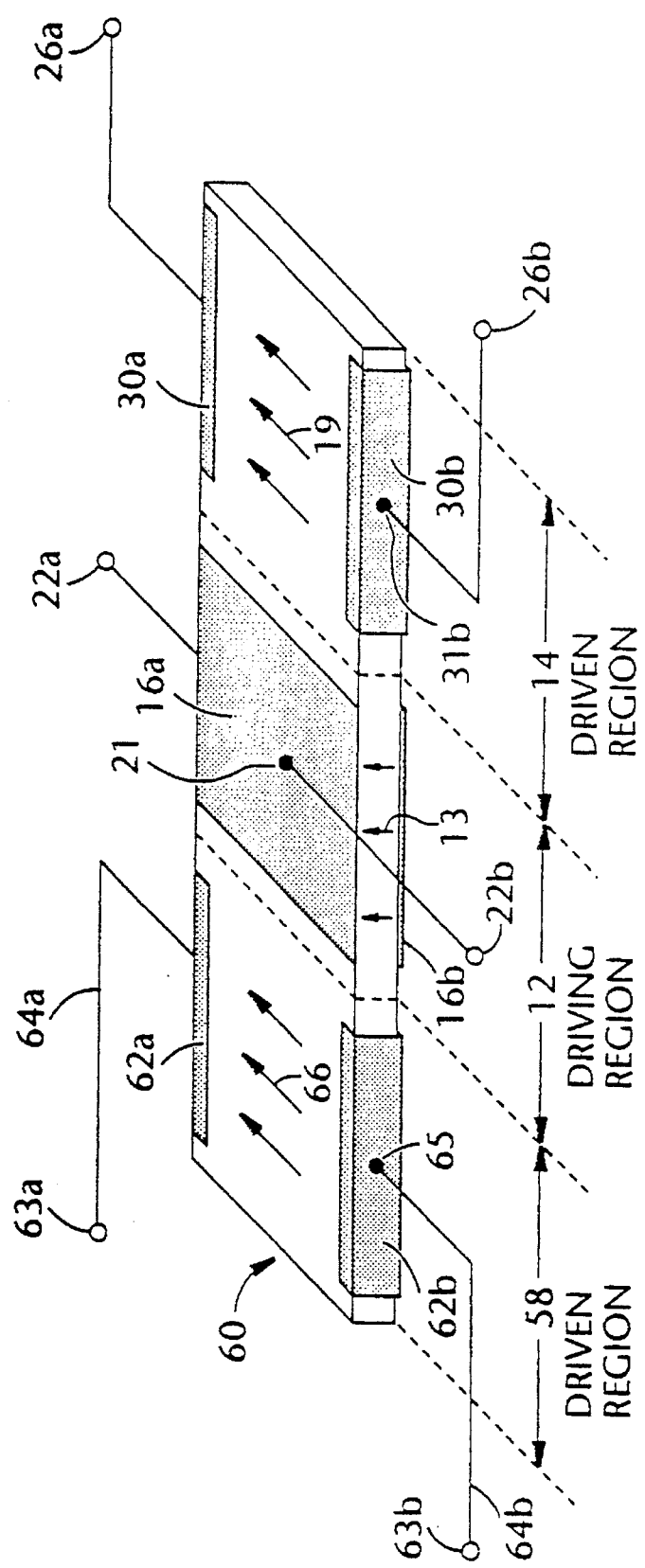
FIG. 6 is a schematic perspective view of a fourth embodiment of the present invention.

Reference is made to FIG. 6, where a fourth embodiment of the present invention is shown in perspective view.

The transformer shown in FIG. 6 features two driven regions. Viz., it is further provided with a second driven region 58. The second driven region 58 has a pair of electrodes 62a and 62b which are coupled to output terminals 63a and 63b via lines 64a and 64b, respectively. A pair of junctions (only one, denoted by numeral 65, being shown in this figure) are respectively applied to the electrodes 62a and 62b in the same manner as the driven region 14. Further, the driven region 58 is polarized as shown by arrows 66.

The body 60 of FIG. 6 vibrates in a mechanical resonance mode of $3\lambda/2$. It is understood that all the junctions of the fourth embodiment are attached to the resonance nodes of the body 60.

The transformer shown in FIG. 6 was fabricated to form a body 60 having a length of 112.5 mm, a width of 20.0 mm, and a thickness of 1.6 mm. The electrodes of the regions 12, 14 and 58 were separated by a distance of 8 mm in the longitudinal direction. When a sine wave voltage of 24 V was applied as Vin, the body 60 resonated at 32 KHz. The output voltage Vout was 1300 V when an output impedance was 338 K$\Omega$.

EMBODIMENT 5

Figure 7:
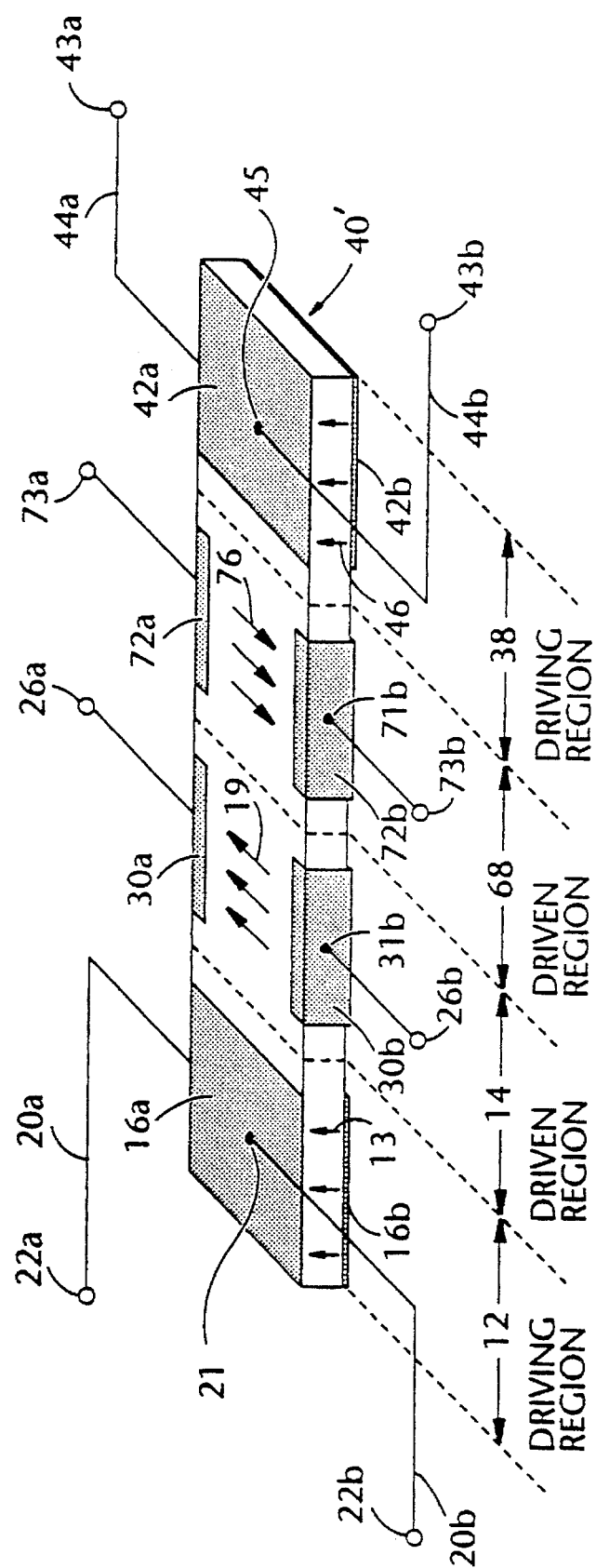
FIG. 7 is a schematic perspective view of a fifth embodiment of the present invention.

Reference is made to FIG. 7, where a fifth embodiment of the present invention is shown in perspective view.

The transformer shown in FIG. 7 is further provided with another driven region 68 as compared with the third embodiment shown in FIG. 5. In this embodiment the driven region 68 has a pair of electrodes 72a and 72b which are coupled to output terminals 73a and 73b, respectively. A pair of junctions 71b (only one is shown) is respectively applied to the electrodes 72a and 72b in the same manner as the driven region 14. Further, the driven region 68 is polarized as shown by arrows 76. That is, the driven regions 14 and 68 are polarized in opposite directions.

The body 40' of FIG. 7 vibrates in a mechanical resonance mode of $2\lambda$. It is understood that all the junctions of the fifth embodiment are attached to the resonance nodes of the body 40'.

The transformer shown in FIG. 7 was fabricated such that the body 40 had a length of 150.0 mm, a width of 20.0 mm, and a thickness of 1.6 mm. The electrodes of the regions 12, 14, 68 and 38 were separated, with respect to the adjacent region(s), by 8 mm in the longitudinal direction of the body 40'.

In this arrangement the output terminal 26a was coupled to 73a while the output terminals 26b was coupled to 73b. Further, the input terminals 22a and 43a are coupled together while the input terminals 22b and 43b are coupled together. When a sine wave voltage of 24 V was applied to the pair of coupled input terminals, the body 40' resonated at 32 KHz. The output voltage obtained was 1250 V when an output impedance was 338 KΩ.

By the contrast, the output terminals 26a and 73b were coupled together while the other terminals 26b and 73a were coupled. The input terminals were coupled as mentioned above. With these lead connections, when a sine wave voltage of 1 V was applied to the body 40', the body 40' resonated at the frequency 32 KHz, and the transformation ratio of 104.0 was obtained.

EMBODIMENT 6

Figure 8:
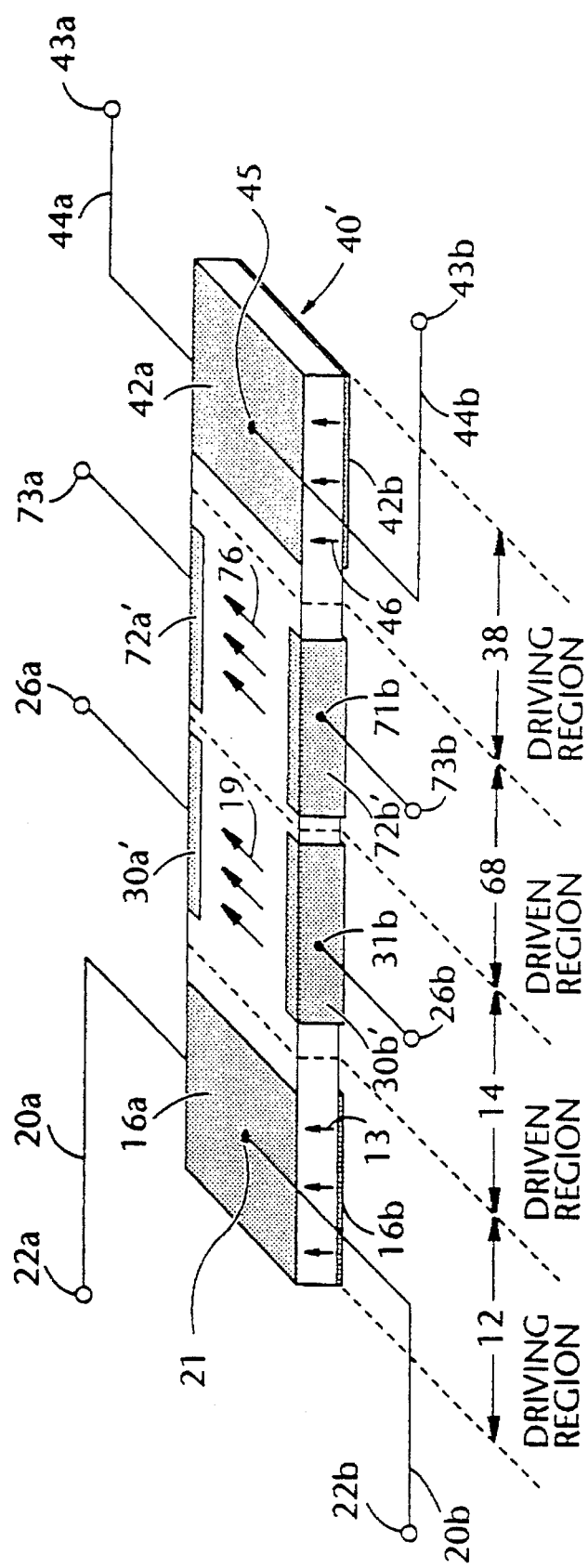
FIG. 8 is a schematic perspective view of a sixth embodiment of the present invention.

Reference is made to FIG. 8, wherein a sixth embodiment of the present invention is shown in perspective view.

The sixth embodiment differs from the fifth embodiment in that: (a) the driven region 68 of the sixth embodiment is oppositely polarized as compared with the fifth embodiment and (b) electrodes of the driven regions 14 and 68, which are denoted by 30a', 30b', 72a' and 72b', extend to the central portion of the body 40'. Other than this, the sixth embodiment is essentially the same as the fifth embodiment.

The embodiment shown in FIG. 8 was fabricated such that the body 40 had the same dimensions as in the case of the above-mentioned fifth embodiment. The electrodes of the regions 14 and 68 were separated by 2 mm while the electrodes of the driving regions 12 and 38 were separated by a distance of 8 mm with respect to those of the adjacent regions 14 and 68, respectively.

The output terminal 26a was coupled to 73b while the output terminals 26b was coupled to 73a. Further, the input terminals 22a and 43a were coupled together while the input terminals 22b and 43b were coupled together. After polarization, when a sine wave voltage of 24 V was applied to the pair of the coupled input terminals, the body 40' resonated at 32 KHz. The output voltage obtained was 1300 V when an output impedance was is 338 KΩ.

EMBODIMENT 7

Figure 9:
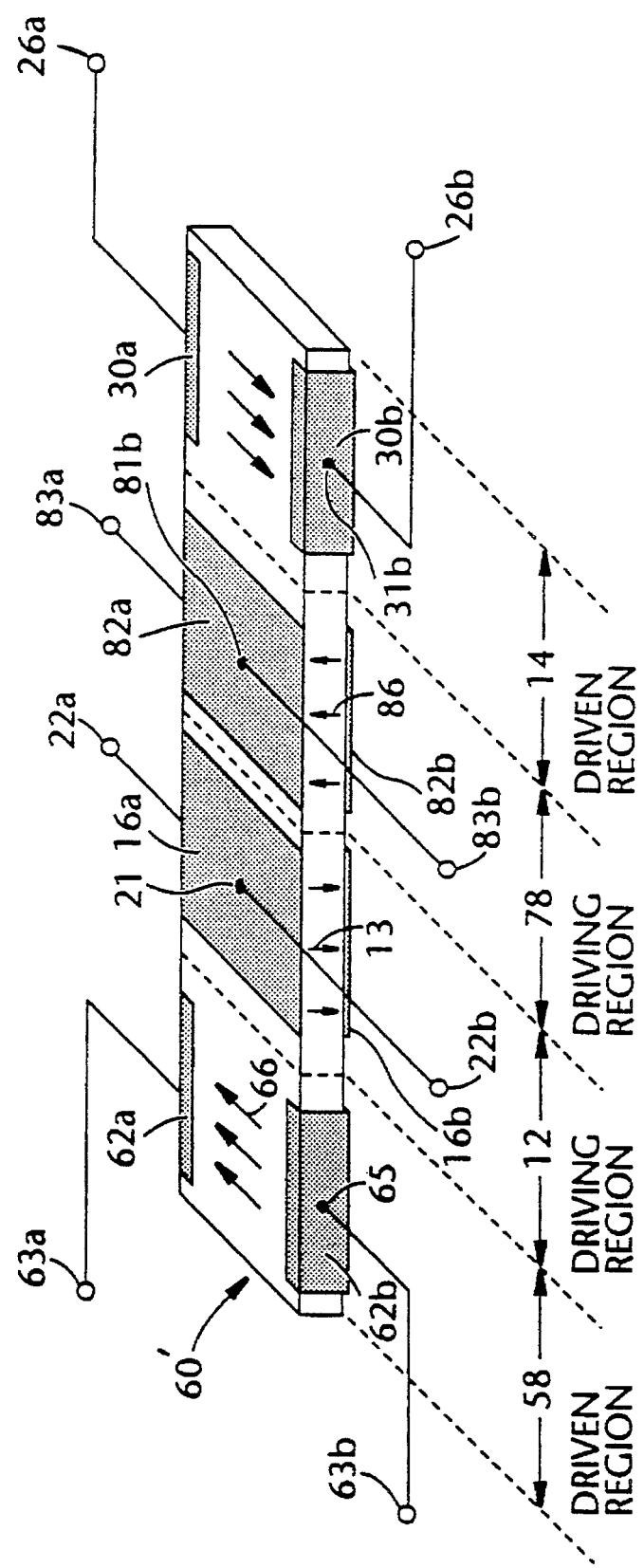
FIG. 9 is a schematic perspective view of a seventh embodiment of the present invention.

Reference is made to FIG. 9, where a seventh embodiment of the present invention is shown in perspective view.

The transformer shown in FIG. 9 is further provided with a driving region 78 in addition to that of the fourth embodiment shown in FIG. 6. In this embodiment the driving region 78 has a pair of electrodes 82a and 82b which are coupled to output terminals 83a and 83b, respectively. A pair of junctions (only one is denoted by numeral 81b) are respectively applied to the electrodes 82a and 82b in the same manner as the driving region 12. Further, the driving region 78 is polarized as shown by arrows 86.

The body 60' of FIG. 7 vibrates in a mechanical resonance mode of 2λ. It is understood that all the junctions of the seventh embodiment are attached to the resonance nodes of the body 60'.

The inventors fabricated this transformer such that the body 40 has a length of 150.0 mm, a width of 20.0 mm, and a thickness of 1.6 mm. The electrodes of the driving regions 12 and 78 were separated by a distance of 2 mm while each of the electrodes of the driven regions 14 and 58 was separated by a distance of 8 mm with respect to those of the adjacent regions 78 and 12, respectively.

The input terminals 22a and 43a were coupled together while the input terminals 22b and 43b were coupled together. When a sine wave voltage of 24 V was applied to the pair of coupled input terminals, the body 60' resonated at 32 KHz. The output voltage obtained at each pairs of 26a–26b and 63a–63b was 1300 V when an output impedance was 676 KΩ.

EMBODIMENT 8

An eighth embodiment of the present invention will be described with reference to FIGS. 10–12.

Figure 10:
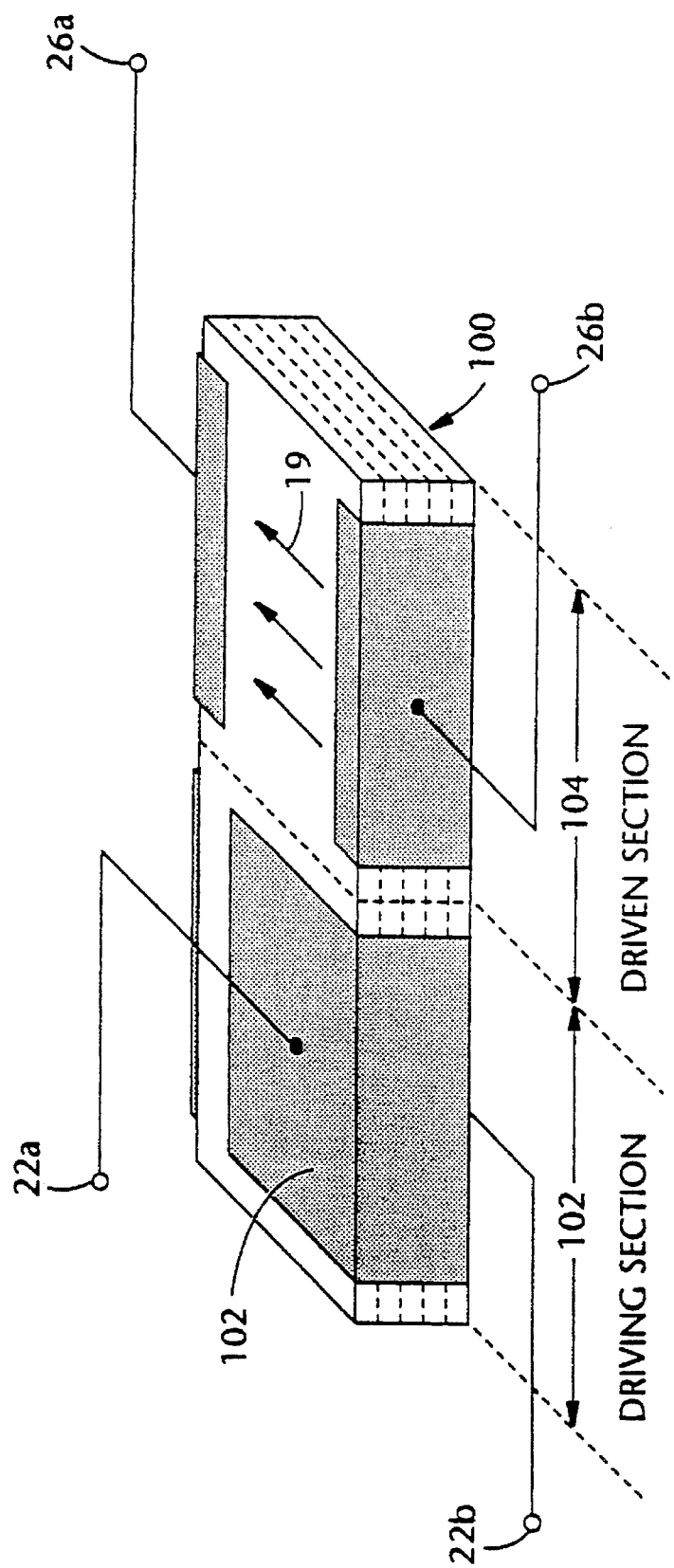
FIG. 10 is a schematic perspective view of an eighth embodiment of the present invention.

FIG. 10 is a perspective view of the transformer according to the eighth embodiment. FIG. 11 is a cross section taken along a line perpendicular to the longitudinal direction of a multi-layer body 100 and shows a driving region of the transformer. On the other hand, FIG. 12 is a cross section taken along a line in the same direction as in FIG. 11 and shows a driven region of the transformer.

The piezoelectric transformer of this embodiment is essentially similar to the first embodiment shown in FIGS. 3A and 3B. The multi-layer body 100 is equally divided into driving and driven regions 102 and 104 in the longitudinal direction of the body 100.

Figure 11:
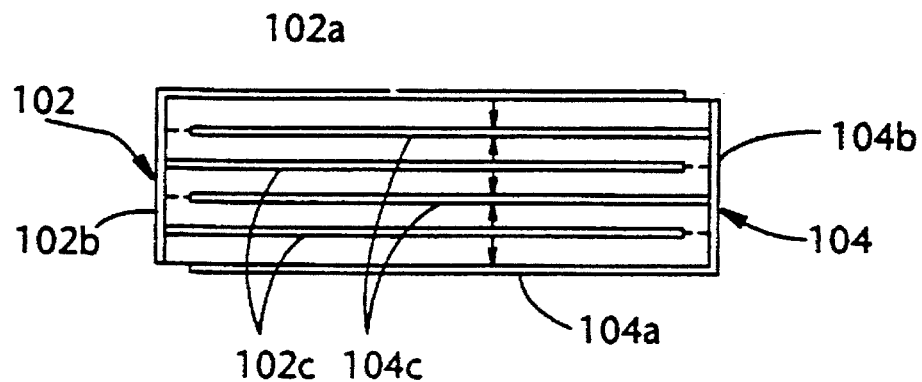
FIG. 11 is a cross section of a driving region of the eighth embodiment.

As best shown in FIG. 11, the driving region 102 has two electrodes 102 and 104. The electrode 102 includes a first and second portions 102a and 102b and further includes a plurality of third portions 102a. The first and second portions 102a and 102b are respectively formed on one major surface of the body 100 and one side surface in a plane parallel to the longitudinal direction of the body 100. A plurality of the third portions 102c each of which has substantially the same shape as the first portion 102a and which extend internally inwardly from the above-mentioned side surface. The second portion 102b serves to electrically connect the first and third portions 102a and 102c. Similarly, the electrode 104 includes a first and second portions 104a and 104b and further includes a plurality of third portions 102c. As shown in FIG. 11, the electrodes 102c and 104c are alternately provided in the sketched direction of the body 100. The driving region 162 are polarized as indicated by arrows.

Figure 12:
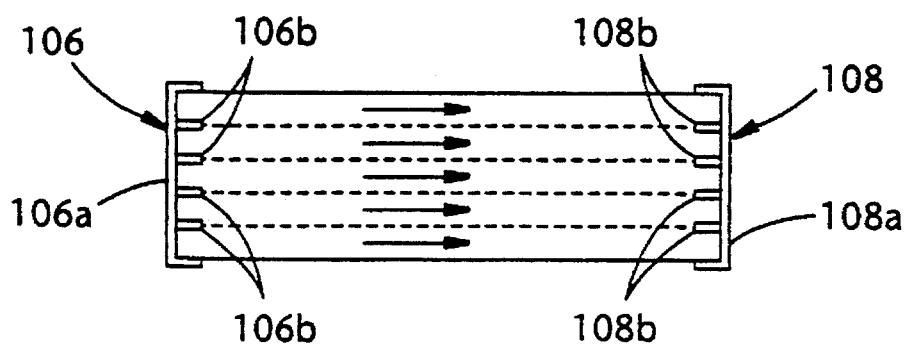
FIG. 12 is a cross section of a driven region of the eighth embodiment.
Figure 13:
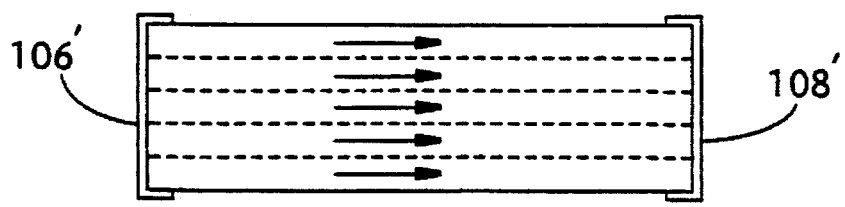
FIG. 13 is a cross section of a variant of the driven region of the eighth embodiment.

As shown in FIGS. 10 and 12, the driven region 104 has a pair of electrodes 106 and 108. The electrode 106 consists of a first portion 106a and a plurality of second portions 106b. The first portion 106a is identical to the electrode 30a or 30b of FIG. 3A. Each of the second portions 106b has substantially the same shape as the electrode 34a or 34b of the second embodiment shown in FIG. 4A and extends internally inwardly from the side surface. The second portions 106b are provided to maintain a uniform longitudinal thickness of the body 100 and are particularly effective in the case where a large number of layers are to be laminated. However, if the number of the layers forming the body 100 is relatively small, the second portions 106b and 108b can be omitted as shown in FIG. 13. The driven region 104 is polarized in the direction as indicated by arrows (FIGS. 12 and 13).

The multi-layer body 100 including therein a plurality of electrodes can be manufactured using well known sintering techniques while applying pressure to the stacked layers.

The electrode configuration shown in the second embodiment (FIGS. 4A and 4B) can be applied to the third to seventh embodiments.

It will be understood that the above disclosure is representative of only eight possible embodiments and that various modifications can be made without departing from the concept of the instant invention.

What is claimed is:

1. A piezoelectric transformer comprising:

a long relatively thin rectangular body of piezoelectric material, said body having first and second major surfaces and exhibiting a resonance mode of vibration at a predetermined frequency in a longitudinal direction thereof, said body being divided into a plurality of regions in said longitudinal direction, first and second electrodes applied respectively to said first and second major surfaces of a first region of said plurality of regions, said first region being polarized in a thickness direction of said body; and third and fourth electrodes which are formed such as to respectively cover opposite side surfaces of a second region of said plurality of regions in a plane parallel to said longitudinal direction of said body and to respectively extend inwardly in a transverse direction of said body by a predetermined amount over said first and second major surfaces of said second region, said second region being polarized in a direction perpendicular to said longitudinal direction, wherein said plurality of regions further include:

a third region which is provided outside of said second region, said third region being provided with fifth and sixth electrodes applied respectively to said first and second major surfaces of said third region, said third region being polarized in a thickness direction of said body, and a fourth region which is provided between said second and third regions, said fourth region being provided with seventh and eighth electrodes which are formed such as to respectively cover opposite side surfaces of said fourth region in a plane parallel to said longitudinal direction of said body and to respectively extend inwardly in a transverse direction of said body by a predetermined amount over said first and second major surfaces of said fourth region, said fourth region being polarized in a direction perpendicular to said longitudinal direction.

2. A piezoelectric transformer as claimed in claim 1, wherein said body is resonates as a full-wave resonator at said predetermined frequency.

3. A piezoelectric transformer as claimed in claim 1, wherein said body is resonates as a one-and-half-wave resonator at said predetermined frequency.

4. A piezoelectric transformer comprising:

a long relatively thin rectangular body of piezoelectric material, said body having first and second major surfaces and exhibiting a resonance mode of vibration at a predetermined frequency in a longitudinal direction thereof, said body being divided into a plurality of regions in said longitudinal direction, first and second electrodes applied respectively to said first and second major surfaces of a first region of said plurality of regions, said first region being polarized in a thickness direction of said body; and third and fourth electrodes which are formed such as to respectively cover opposite side surfaces of a second region of said plurality of regions in a plane parallel to said longitudinal direction of said body and to respectively extend inwardly in a transverse direction of said body by a predetermined amount over said first and second major surfaces of said second region, said second region being polarized in a direction perpendicular to said longitudinal direction, wherein said plurality of regions further include:

a third region which is provided outside of said first region, said third region being provided with fifth and sixth electrodes which are formed such as to respectively cover opposite side surfaces of said third region in a plane parallel to said longitudinal direction of said body and to respectively extend inwardly in a transverse direction of said body by a predetermined amount over said first and second major surfaces of said third region, said third region being polarized in a direction perpendicular to said longitudinal direction, and a fourth region which is provided between said first and second regions, said fourth region being provided with seventh and eighth electrodes applied respectively to said first and second major surfaces of said fourth region, said fourth region being polarized in a thickness direction of said body.

5. A piezoelectric transformer as claimed in claim 1, wherein said second and fourth regions are polarized in opposite directions.

6. A piezoelectric transformer as claimed in claim 1, wherein said second and fourth regions are polarized in same directions.

7. A piezoelectric transformer as claimed in claim 4, wherein said body is resonates as a one-and-half-wave resonator at said predetermined frequency.

* * * * *

UNITED STATES PATENT AND TRADEMARK OFFICE
CERTIFICATE OF CORRECTION

PATENT NO.    : 5,463,266
DATED         : October 31, 1995
INVENTOR(S)   : Akira FUKUOKA, Jun KAWAI and Satoru TAGAMI It is certified that error(s) appears in the above-identified patent and that said Letters Patent is hereby corrected as shown below:

Col. 8, line 26, delete "102a" and insert --102c--.

Signed and Sealed this

Eleventh Day of June, 1996

Attest:

BRUCE LEHMAN

Attesting Officer

Commissioner of Patents and Trademarks